(12) United States Patent

Elsayed et al.

(10) Patent No.: US 10,090,674 B2
(45) Date of Patent: Oct. 2, 2018

(54) MAXIMUM SUPPLY VOLTAGE SELECTION

(71) Applicant: Silicon Laboratories Inc., Austin, TX (US)

(72) Inventors: Mohamed Mostafa Elsayed, Austin, TX (US); Kenneth W. Fernald, Austin, TX (US); Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/860,186

(22) Filed: Sep. 21, 2015

(65) Prior Publication Data

US 2017/0085081 A1    Mar. 23, 2017

(51) Int. Cl.
*H02J 1/10*      (2006.01)
*H03K 5/24*      (2006.01)

(52) U.S. Cl.
CPC ............ *H02J 1/10* (2013.01); *H03K 5/249* (2013.01)

(58) Field of Classification Search
USPC ...... 307/50, 70, 75, 80, 87; 327/58, 63, 407, 327/547
See application file for complete search history.

(56) References Cited

U.S. PATENT DOCUMENTS

| | | | | |
|---|---|---|---|---|
| 5,886,543 A | * | 3/1999 | Moody | H03K 17/687 327/434 |
| 6,028,486 A | * | 2/2000 | Andre | H03F 1/0244 330/295 |
| 2008/0048729 A1 | * | 2/2008 | Ehrenreich | G03F 7/70516 327/63 |
| 2009/0146499 A1 | * | 6/2009 | Takeda | G11C 16/30 307/80 |
| 2014/0346878 A1 | * | 11/2014 | Umeyama | H03K 3/012 307/52 |
| 2015/0132862 A1 | * | 5/2015 | Hook | H01L 21/326 438/4 |

* cited by examiner

*Primary Examiner* — Daniel Kessie
(74) *Attorney, Agent, or Firm* — Trop, Pruner & Hu, P.C.

(57) ABSTRACT

A method includes providing supply voltages to a supply voltage switching circuit that controls routing of the supply voltages to power consuming circuitry associated with the supply voltage switching circuit. The method includes comparing the supply voltages, including using at least one relatively lower precision comparator to compare the supply voltages for a relatively large difference between the supply voltages; and using at least one relatively higher precision comparator to compare the supply voltages for a relatively smaller difference between the supply voltages. The method further includes, based on a result of comparing the supply voltages, selectively coupling the supply voltages to at least one of an isolation well and a power supply rail of the supply voltage switching circuit.

20 Claims, 13 Drawing Sheets

US 10,090,674 B2

MAXIMUM SUPPLY VOLTAGE SELECTION

BACKGROUND

A given mobile device, such as a smartphone or tablet, may receive power from one of multiple power sources. In this manner, a given mobile device may receive power from a Universal Serial Bus (USB) interface, a battery, an AC power adapter and so forth. Moreover, the mobile device contains circuitry to select, at a given time, the power source that is to provide power to the mobile device.

SUMMARY

In an example embodiment, a method includes providing supply voltages to a supply voltage switching circuit that controls routing of the supply voltages to power consuming circuitry associated with the supply voltage switching circuit. The method includes comparing the supply voltages, including using at least one relatively lower precision comparator to compare the supply voltages for a relatively large difference between the supply voltages; and using at least one relatively higher precision comparator to compare the supply voltages for a relatively smaller difference between the supply voltages. The method further includes, based on a result of comparing the supply voltages, selectively coupling the supply voltages to at least one of an isolation well and a power supply rail of the supply voltage switching circuit.

In another example embodiment, an apparatus includes a supply voltage switching circuit; at least one static comparator; at least one dynamic comparator; and at least one switch. The supply voltage switching circuit selectively couples a plurality of supply voltages to power consuming circuitry that is associated with the supply voltage switching circuit. The static comparator(s) compare magnitudes of the supply voltages, and the dynamic comparator(s) compare magnitudes of the supply voltages. The switch(es) selectively couple one of the supply voltages to a supply rail or isolation well of the supply voltage switching circuit based at least in part on comparison results indicated by the static comparator(s) and the dynamic comparator(s).

In yet another example embodiment, an apparatus includes an integrated circuit that is adapted to receive multiple source supply voltages, where the source supply voltages include a first source supply voltage and a second source supply voltage. The integrated circuit includes a supply voltage switching circuit, a passive comparator, an active comparator and at least one switch. The supply voltage switching circuit controls routing of the source supply voltages to power consuming circuitry. The passive comparator responds to a magnitude of a difference between the first source supply voltage and the second source supply voltage being above a threshold to couple the greater of the first source supply voltage and the second source supply voltage to the supply voltage switching circuit. The active comparator responds to the magnitude of the difference between the first source supply voltage and the second source supply voltage being below the threshold to compare the first source supply voltage to the second source supply voltage. The switch(es) respond to a result of the comparison by the active comparator to couple the greater of the first source supply voltage and the second source supply voltage to the supply voltage switching circuit.

Advantages and other desired features will become apparent from the following drawings, description and claims.

DETAILED DESCRIPTION

Figure 1:
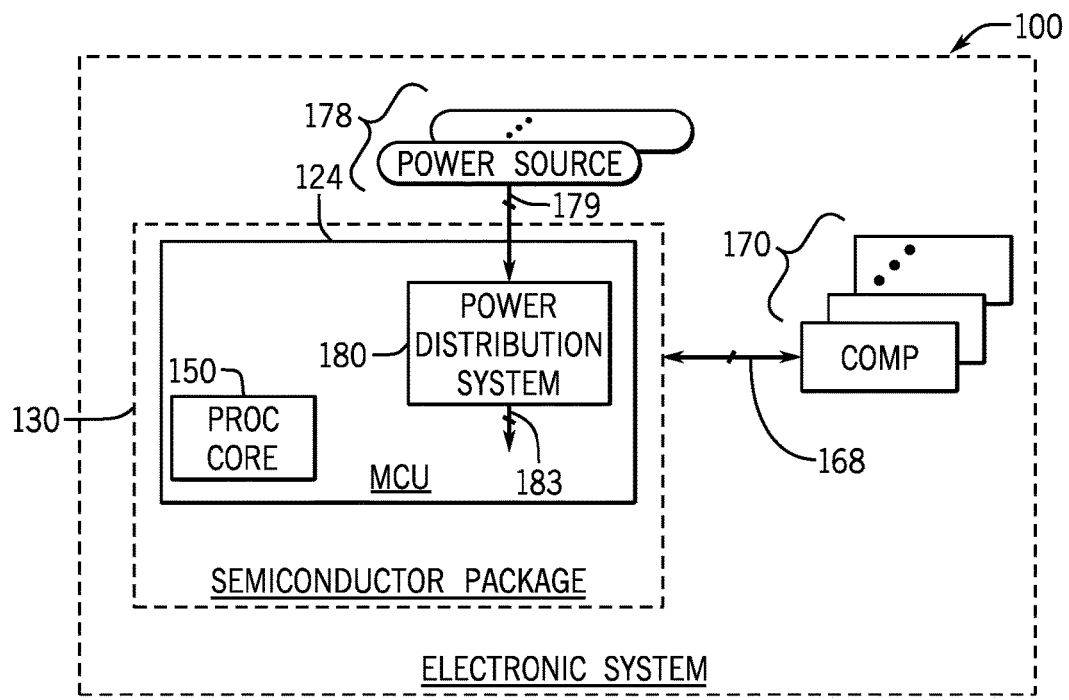
FIG. 1 is a schematic diagram of an electronic system according to an example embodiment.

Techniques and systems are disclosed herein to efficiently distribute power in an electronic system that has multiple potential sources for its power. More specifically, in accordance with example embodiments, multiple supply voltages (called "source supply voltages" herein) may be available to the electronic system, such as a source supply voltage that is provided by a battery, a source supply voltage provided by an AC wall adapter, and so forth; and the electronic system contains switching circuitry to select one of the source supply voltages and distribute the selected supply voltage to power consuming components of the electronic system. For such purposes as minimizing static power consumption of the switching circuitry, the electronic system identifies the maximum source supply voltage and couples this maximum source supply voltage to the power supply rail and isolation wells of the switching circuitry.

In accordance with example systems and techniques that are described herein, the electronic system selects the maximum source supply voltage using two different types of comparators: a relatively higher precision and higher power consuming comparator to select the largest source supply voltages when the source supply voltages differ in magnitude by a relatively small degree; and a lower precision, lower power consuming comparator to select the largest source supply voltage for relatively larger voltage differences. A particular advantage of this technique is that the higher precision and higher power consuming comparator circuit may be disabled or powered down at least part of the time for purposes of conserving power. Depending on the particular embodiment, the electronic system may activate and deactivate (power up and power down, for example) the higher precision comparator based on a time schedule or based on a source supply voltage difference, as described further herein.

More specifically, in accordance with some embodiments, the electronic system may periodically activate and deactivate the higher precision comparator. In this manner, in accordance with example embodiments, the electronic system selects the maximum source supply voltage using at least one lower power consuming, static comparator and at least one higher power consuming, dynamic comparator. In accordance with example implementations, the static comparator is always powered up to continuously compare source supply voltages. The dynamic comparator is periodically powered up to compare the same source supply voltages and then, pursuant to the same periodic scheduling, is turned off when the comparison is not being made. In general, the dynamic comparator has a relatively small resolution, i.e., the dynamic comparator is constructed to respond to relatively small differences between the source supply voltages that are being compared by the dynamic comparator and indicate (via assertion or de-assertion of its output signal) the result of the comparison. This is to be contrasted to the static comparator, which has a relatively larger resolution, in that the static comparator is unable to indicate an accurate comparison result for relatively small voltages differences.

Although the dynamic comparator consumes more power than the static comparator when powered on, the periodic powering off of the dynamic comparator limits its overall power consumption. Thus, in accordance with some embodiments, a power consumption versus comparison resolution tradeoff is made: the dynamic comparator is periodically powered on to indicate which source supply voltage of the voltages being compared is the largest; and the static comparator, although not as precise as the dynamic comparator, is continually powered on to indicate which of the voltages is the largest to thereby reduce the time for identifying the maximum voltage, if the voltage difference is large enough for the static comparator to resolve.

In accordance with example embodiments, the dynamic comparator is powered up and down using a clock signal so that when the clock signal has a given logic state (a logic one state, for example), the dynamic comparator is powered up and provides a comparison result; and when the clock signal has the opposite logic state (a logic zero state for this example) the dynamic comparator is powered down and unavailable. Moreover, in accordance with example embodiments, when the static comparator cannot resolve which source supply voltage is smaller, the output of the static comparator is tri-stated to indicate a non-decision. As such, the static comparator may be modeled as a tri state comparator, i.e., a comparator that has a set state, a non-decision state, and a reset state. In accordance with example embodiments, when the voltage difference is relatively small such that the static comparator cannot provide a comparison result, the power that is consumed by the static comparator is also relatively small so that remaining in a non-decision state is acceptable until the next dynamic comparator decision is available.

FIG. 1 depicts an example embodiment of an electronic system 100 that contains a microcontroller unit (MCU) 124 and components 170 that are controlled by the MCU 124 via hardwired and/or wireless inputs/outputs (I/Os) 168 of the MCU 124. As examples, the component(s) 170 may include one or more of the following depending on the particular application: a lighting element (such as a light emitting diode (LED), for example); an electrical motor; a household appliance; an inventory control terminal; a computer; a tablet; a smart power meter; a wireless interface; a cellular interface; an interactive touch screen user interface; and so forth.

As depicted in FIG. 1, the MCU 124, in accordance with example embodiments, includes a power distribution system 180, which may receive multiple source supply voltages from multiple power sources 178 (via inputs 179). As examples, the power sources 178 may be a battery, a Universal Serial Bus (USB) interface, an AC wall adapter, a wireless power transmitter, and so forth and may or may not be partially integrated into the MCU 124. The power distribution system 180, in accordance with example embodiments, contains switching circuitry to select and couple one of the source supply voltages to power supply rails 183 of the MCU 124, which communicate power to various power consuming components of the MCU 124, such as DC-to-DC regulators, analog components, digital components, and so forth. The power distribution system 180 also identifies a maximum source supply voltage among the received source supply voltages and couples the identified maximum voltage to the power supply rail(s) and isolation well(s) of its switching circuitry for purposes of limiting the static power consumption of the switching circuitry.

All or part of the components of the MCU 124 may be part of a semiconductor package 130. More specifically, referring to FIG. 2 in conjunction with FIG. 1, in accordance with some embodiments, all or part of the components of the MCU 124 may be part of an integrated circuit (IC) 200. As examples, all or part of the components of the MCU 124 may be fabricated on a single die or on multiple dies. The integrated circuit 200 may be packaged to form the semiconductor package 130.

Among its components, the MCU 124 includes a processing core 150 and analog and digital peripheral components 290. The digital components may include peripheral components that communicate with the processing core 150 and a memory system 250 of the MCU 124 over a system bus 230, such as (as examples) direct memory access (DMA) engines, universal asynchronous receiver/transmitter (UART) devices, serial peripheral interface (SPI) devices, programmable timers, a packet radio, I/O buffers, a Universal Serial Bus (USB) interface, and so forth. The analog components include various components that receive analog signals, such as analog-to-digital converters (ADCs) and comparators; and the MCU 124 may contain analog components that provide analog signals, such as current drivers.

As an example, the processing core 150 may be a 32-bit core, such as the Advanced RISC Machine (ARM) processing core, which executes a Reduced Instruction Set Computer (RISC) instruction set. In further example embodiments, the processing core 150 may be less powerful core, such as an 8-bit core (an 8051 core, for example).

The memory system 250, in accordance with some embodiments, includes a memory manager 260 that controls access to various memory components of the MCU 124, such as a cache 272, a non-volatile memory 268 (a Flash memory, for example) and a volatile memory 264 (a static random access memory (SRAM), for example). In example embodiments, the volatile memory 264 and the non-volatile memory 268 have memory locations that are part of the system memory address space for the MCU 24.

Figure 2:
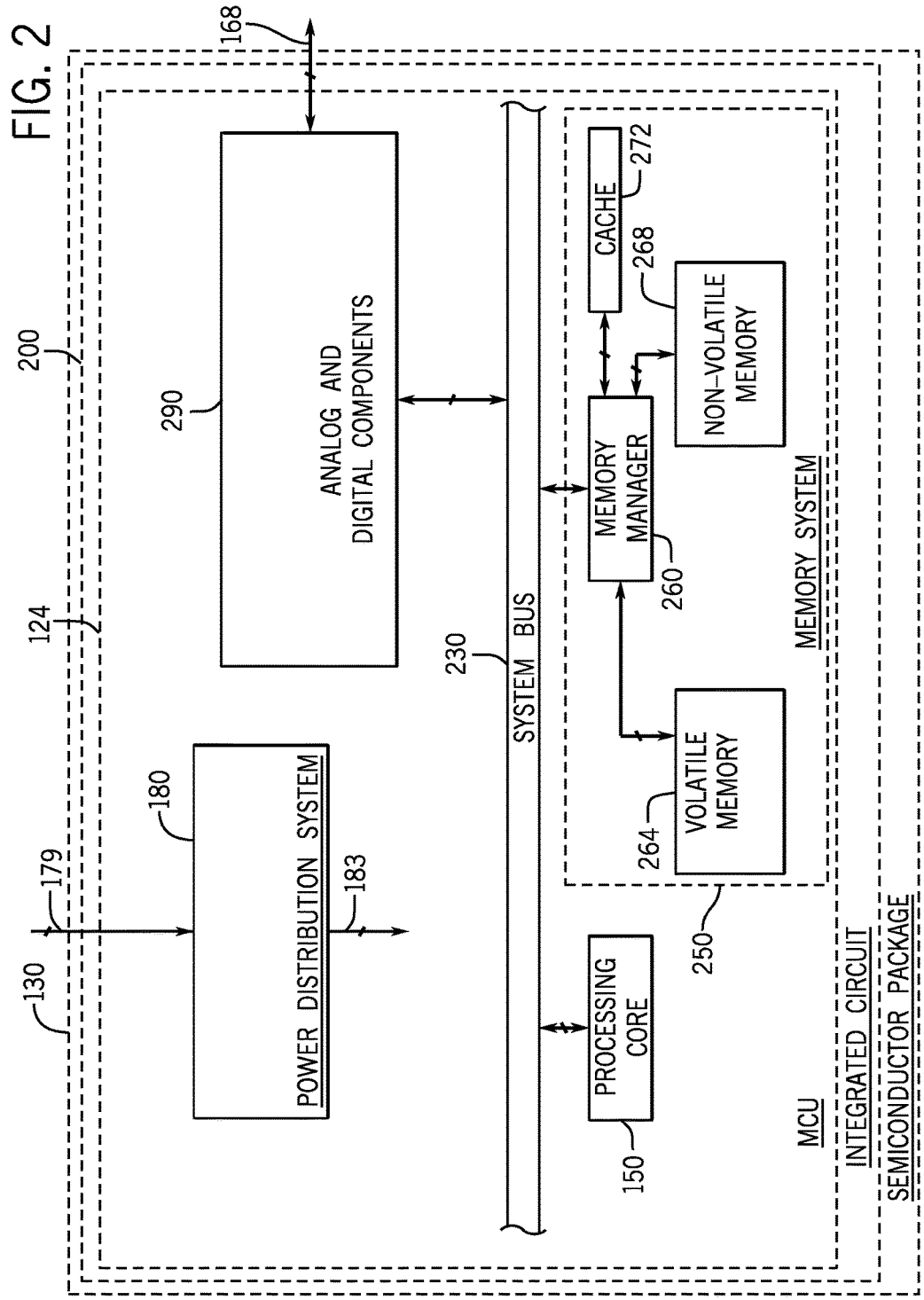
FIG. 2 is a schematic diagram of an MCU of the electronic system of FIG. 1 according to an example embodiment.

It is noted that FIG. 2 depicts a simplified representation of the MCU architecture, as the MCU 124 may have many other components, bridges, buses, and so forth, in accordance with further embodiments, which are not depicted in FIG. 2. For example, in accordance with some embodiments, the MCU 124 may have a bus matrix module that implements slave side arbitration and is used to regulate access to the memory devices of the MCU 124.

Figure 3:
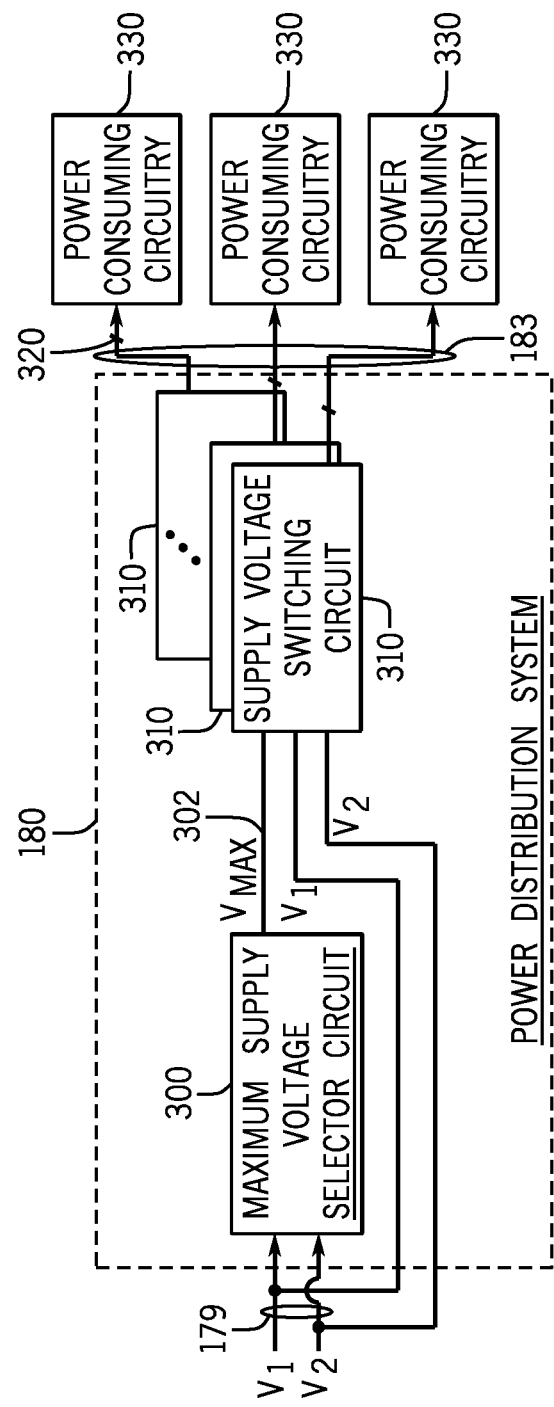
FIG. 3 is a schematic diagram of a power distribution system of the MCU according to an example embodiment.

FIG. 3 depicts the power distribution system 180 for the example embodiment in which the electronic system 100 receives two source supply voltages called "$V_1$" and "$V_2$." One or multiple supply switching circuits 310 of the power distribution system 180, in accordance with example embodiments, selectively route the $V_1$ and $V_2$ source supply voltages to associated power consuming circuits 330. For purposes of minimizing the power consumed by the supply switching circuits 310, power supply rail and isolation well connections of the circuits 310 receive a maximum supply voltage (called "$V_{MAX}$" in FIG. 3).

The $V_{MAX}$ voltage is the maximum supply voltage that is currently being received by the power distribution system 180, as identified by its maximum supply voltage selector circuit 300. In this manner, because the maximum source supply voltage that is received by the electronic system 100 may continually change, for example as power sources 178 (FIG. 1) are connected to and disconnected from the electronic system 100, the maximum supply voltage selector circuit 300 monitors the received source supply voltages, identifies the current maximum magnitude source supply voltage and provides this voltage as the $V_{MAX}$ voltage at its terminal 302.

For the particular embodiment that is depicted in FIG. 3, the maximum supply voltage selector circuit 300 compares the $V_1$ and $V_2$ source supply voltages and couples either the $V_1$ voltage or the $V_2$ voltage to the terminal 302, depending on which source supply voltage is determined by the maximum supply voltage selector circuit 300 to have the largest magnitude.

Figure 4:
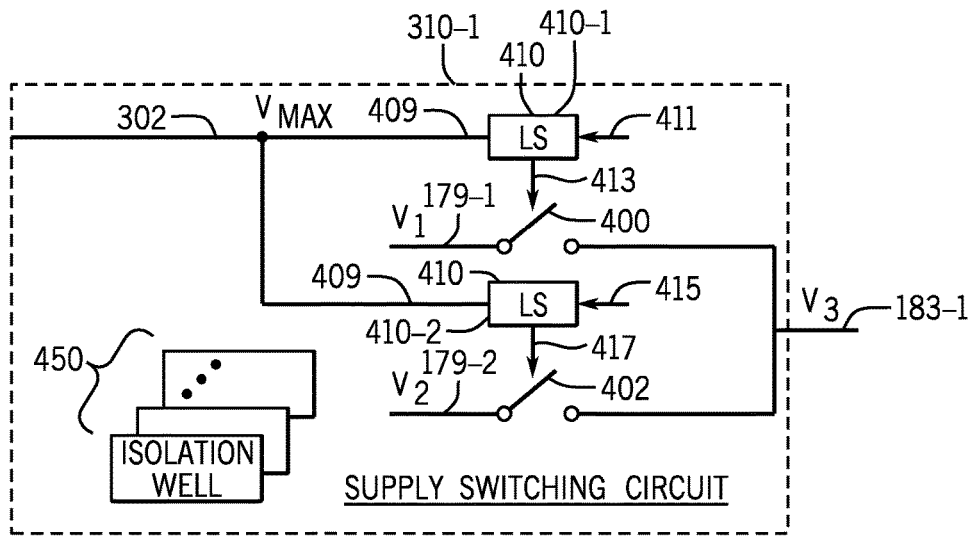
FIG. 4 is a schematic diagram of a supply switching circuit of the MCU according to an example embodiment.

FIG. 4 depicts an embodiment of a supply switching circuit 310-1 (a specific example circuit 310 of FIG. 3), in accordance with an example embodiment. As shown, the $V_{MAX}$ maximum supply voltage terminal 302 is coupled to the supply rails 409 of level shifters 410 (example level shifters 410-1 and 410-2, being depicted in FIG. 4) and coupled to one or multiple isolation wells 450 of the circuit 310-1 (isolation wells for switching transistors of the circuit 310-1, for example). Examples of isolation wells include an n-doped well serving as the body of a p-type transistor. Each level shifter 410 shifts the DC level of a received switch selection signal for purposes of providing a corresponding level-shifted switch selection signal that regulates operation of an associated switch. The level shifter 410-1 receives a switch selection signal at its input 411 and generates a corresponding level shifted switch selection signal at its output 413 to control operation of a switch 400 that, when closed, couples the $V_1$ source supply voltage to an output terminal 183-1 of the circuit 310-1; and the level shifter 410-2 receives a selection signal at its input 415 and generates a corresponding level-shifted, switch selection signal at its output 417 to control operation of a switch 402 that, when closed, couples the $V_2$ source supply voltage to the output terminal 183-1. In general, the switch selection signals that are provided at the outputs 413 and 417 are complimentary, i.e., when one of the switches 400 and 402 is closed, the other switch 402, 400 is open, and vice versa. Thus, by controlling the logic levels of the selection signals that are provided to the level shifters 410-1 and 410-2, the electronic system 100 may couple one of the $V_1$ and $V_2$ source supply voltages to the output 183-1.

In accordance with further example embodiments, the supply voltage switching circuit 310-1 may have additional switches and output terminals; and the supply voltage switching circuit 310-1 may receive more than two source supply voltages, as FIG. 4 merely illustrates an example embodiment for coupling the $V_{MAX}$ maximum supply voltage to the supply voltage rail and isolation well connections of a switching circuit. Thus, many variations are contemplated, which are within the scope of the appended claims.

Figure 5:
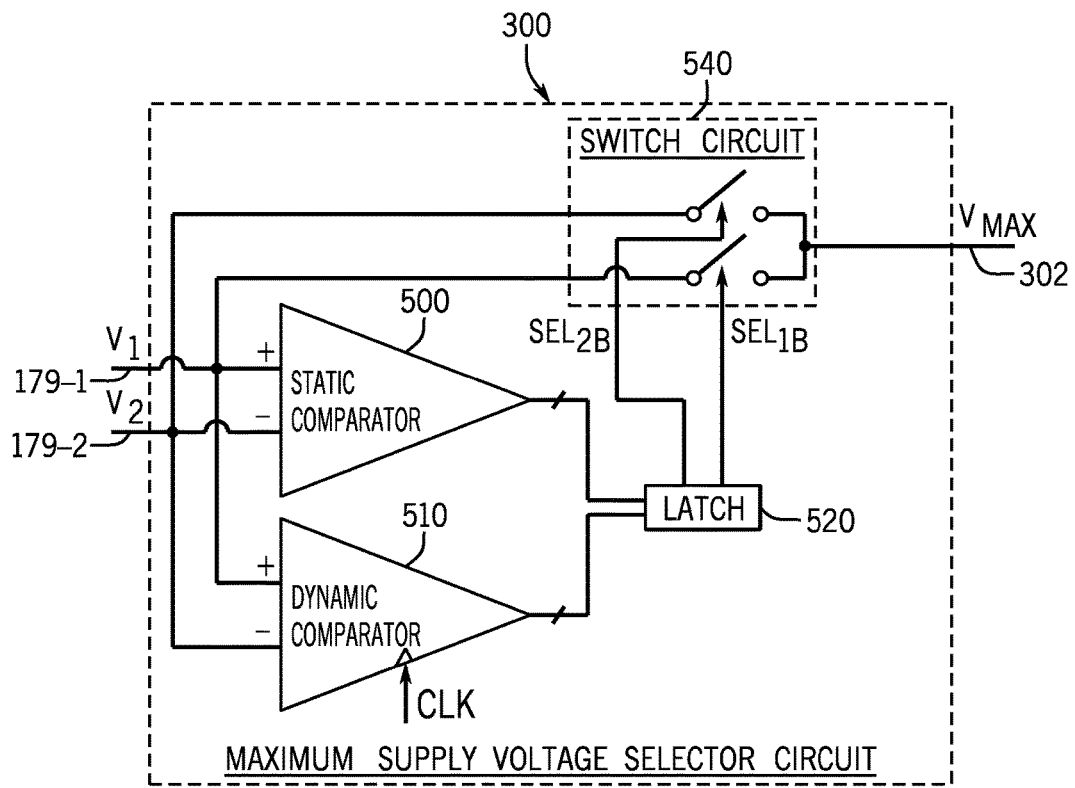
FIG. 5 is a schematic diagram of a maximum supply voltage selector circuit according to an example embodiment.

Referring to FIG. 5, in accordance with example embodiments, the maximum supply voltage selector circuit 300 includes a static comparator 500 and a dynamic comparator 510. The static comparator 500 is coupled to the inputs 179-1 and 179-2 to continually compare the $V_1$ and $V_2$ source supply voltages and control the logic level of its output signal for purposes of indicating the result of the comparison or indicating that a result cannot be determined. In this manner, in accordance with example embodiments, the static comparator 500 has the following output states: a first state (represented by a given logic level of the comparator's output) to indicate that the magnitude of the $V_1$ voltage is higher than the magnitude of the $V_2$ voltage; a second state (represented by another logic level of the comparator's output) to indicate that the magnitude of the $V_2$ voltage is higher than the magnitude of the $V_1$ voltage; and a third state to indicate that the difference between the voltage magnitudes is too small for the static comparator 500 to render a comparison decision. In accordance with example embodiments, the third output state may be represented by the static comparator 500 tri-stating its output (i.e., the third state may be a high resistance state for the output of the comparator 500 in which the comparator neither asserts nor de-asserts the output).

The dynamic comparator 510 is activated and deactivated periodically via a clock signal (called "CLK" in FIG. 5), in accordance with example embodiments, for purposes of allowing the comparator 510 to periodically compare the magnitudes of the $V_1$ and $V_2$ supply voltages and indicate a result of this comparison at the output of the comparator 510. The dynamic comparator 510 is constructed to resolve relatively small differences in magnitude between the $V_1$ and $V_2$ supply voltages (as compared to the static comparator 500); and the overall power that is consumed due to operation of the dynamic comparator 510 is minimized, as the dynamic comparator 510 consumes relatively little, if any, power when deactivated.

As a more specific example, in accordance with example embodiments, the dynamic comparator 510 powers up in response to a particular logic state (a logic one state, for example) of the CLK clock signal and powers down in response to the other logic state (a logic zero state, for example) of the CLK clock signal. Thus, for a fifty percent duty cycle of the CLK clock signal, the dynamic comparator 510 is powered up fifty percent of the time and available to provide a comparison result at its output.

To summarize, the static comparator 500 is constructed to respond to a relatively large voltage magnitude differences to update the latch 520 in response to a sudden magnitude change. Smaller differences may be resolved periodically due to activation of the dynamic comparator 510.

As depicted in FIG. 5, both comparators 500 and 510 have their outputs coupled to a latch 520 that, based on the outputs, generates complementary switch selection signals (called "SEL$_{1B}$" and "SEL$_{2B}$" in FIG. 5) that are provided to a switch circuit 540 to regulate the coupling of the V$_1$ and V$_2$ source supply voltages to V$_{MAX}$ maximum supply voltage terminal 302.

Figure 6A:
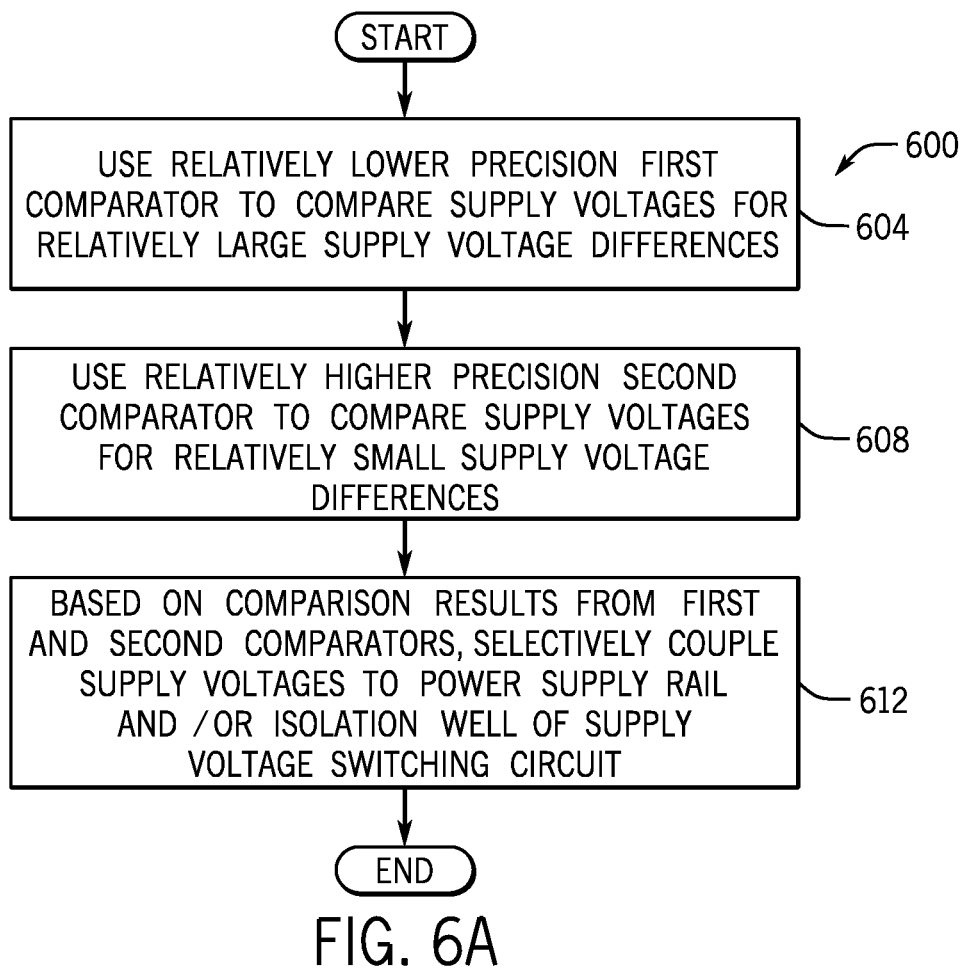
FIGS. 6A, 6B, 13 and 14 are flow diagrams depicting techniques to regulate supply voltage rail and isolation well connections of a supply voltage switching circuit according to example embodiments.

Thus, referring to FIG. 6A, in accordance with example embodiments, a technique 600 includes using (block 604) a lower precision, first comparator to compare supply voltages for relatively large supply voltage differences and using (block 608) a relatively higher precision, second comparator to compare the supply voltages for relatively small supply voltage differences. The technique 600 includes selectively coupling the supply voltages (coupling the largest magnitude supply voltage, for example) to at least one power supply rail and/or at least one isolation well of a supply voltage switching circuit, based on the comparison results from first and second comparators, pursuant to block 612.

Figure 6B:
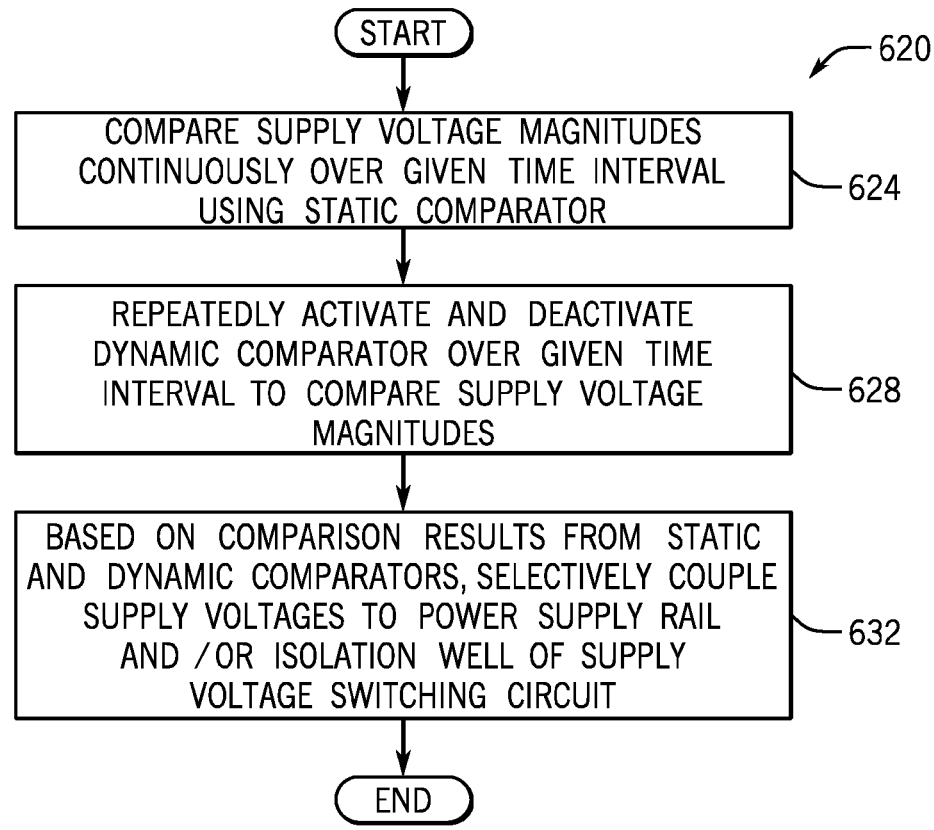

More specifically, referring to FIG. 6B, in accordance with example embodiments described herein, a technique 620 includes comparing (block 624) supply voltages continuously over a given time interval using a static comparator and repeatedly activating and deactivating a dynamic comparator over the given time interval to compare the supply voltages, pursuant to block 628. The technique 620 includes selectively coupling the supply voltages to at least one power supply rail and/or at least one isolation of a supply voltage switching circuit, based on the comparison results from the static and dynamic comparators, pursuant to block 632.

Figure 7:
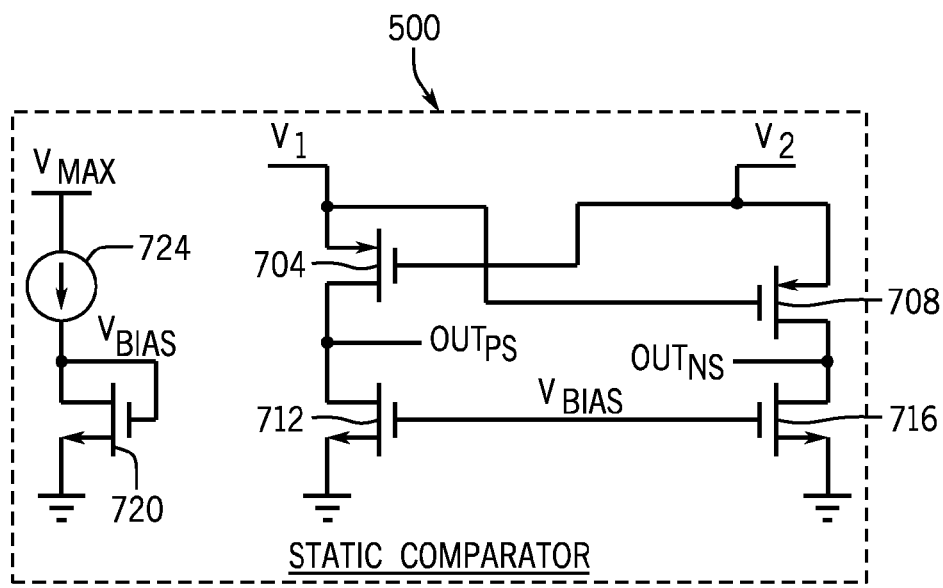
FIG. 7 is a schematic diagram of a static comparator of the maximum supply voltage selector circuit of FIG. 5 according to an example embodiment.

Referring to FIG. 7, in accordance with example embodiments, the static comparator 500 includes cross-coupled P-channel metal-oxide-semiconductor field-effect-transistors (PMOSFETs) 704 and 708. In this manner, the gate of the PMOSFET 704 receives the V$_2$ source supply voltage, and the gate of the PMOSFET 708 receives the V$_1$ source supply voltage. The sources of the PMOSFETs 704 and 708 are coupled to the V$_1$ and V$_2$ source supply voltages, respectively. Moreover, the drains of the PMOSFETs 704 and 708 differentially provide a voltage indicative of the comparison result by the static comparator 500: the drain of the PMOSFET 704 provides a signal called "OUT$_{PS}$," and the drain of the PMOSFET 708 provides a signal called "OUT$_{NS}$."

As also depicted in FIG. 7, the static comparator 500 includes biasing circuitry, which includes an N-channel MOSFET (NMOSFET) 712, which has its drain coupled to the drain of the PMOSFET 704 and its source coupled to ground. An NMOSFET 716 has its drain coupled to the drain of the PMOSFET 708, and the source of the NMOSFET 716 is coupled to ground. Moreover, as shown in FIG. 7, the gates of the NMOSFET 712 and 716 receive a bias voltage called "V$_{BIAS}$."

The biasing circuitry of the static comparator 500 also includes a current sink 724 that is coupled to V$_{MAX}$ at terminal 302 and is coupled to ground through an NMOSFET-based diode 720. In this regard, the drain and gates of the NMOSFET 720 are coupled together, and the source of the NMOSFET 720 is coupled to ground.

When the V$_1$ source supply voltage is greater than V$_2$+V$_{THR}$ (where "V$_{THR}$" represents a difference threshold needed for the static comparator 500 to provide an output that represents which of the V$_1$ and V$_2$ voltages are greater), the source-to-drain current path of the PMOSFET 704 pulls the OUT$_{PS}$ signal high to have a magnitude at or near the V$_1$ source supply voltage, and the drain-to-source current path of the NMOSFET 716 pulls the OUT$_{NS}$ signal low to have a magnitude at or near ground, thereby causing the differential voltage OUT$_{PS}$–OUT$_{NS}$ to have a logic one level.

When the V$_2$ source supply voltage is greater than the V$_1$+V$_{THR}$, the source-to-drain current path of the PMOSFET 708 pulls the OUT$_{NS}$ signal high to have a magnitude at or near the V$_2$ source supply voltage, and the drain-to-source current path of the NMOSFET 712 pulls the OUT$_{PS}$ signal low to have a magnitude at or near ground, thereby causing the differential voltage OUT$_{PS}$–OUT$_{NS}$ to have a logic zero level. When the magnitude of the difference between the V$_1$ and V$_2$ source supply voltages is less than V$_{THR}$, the OUT$_{PS}$ and OUT$_{NS}$ signals are each pulled to at or near ground by the drain-to-source current path of NMOSFETs 712 and 716, respectively.

Figure 8:
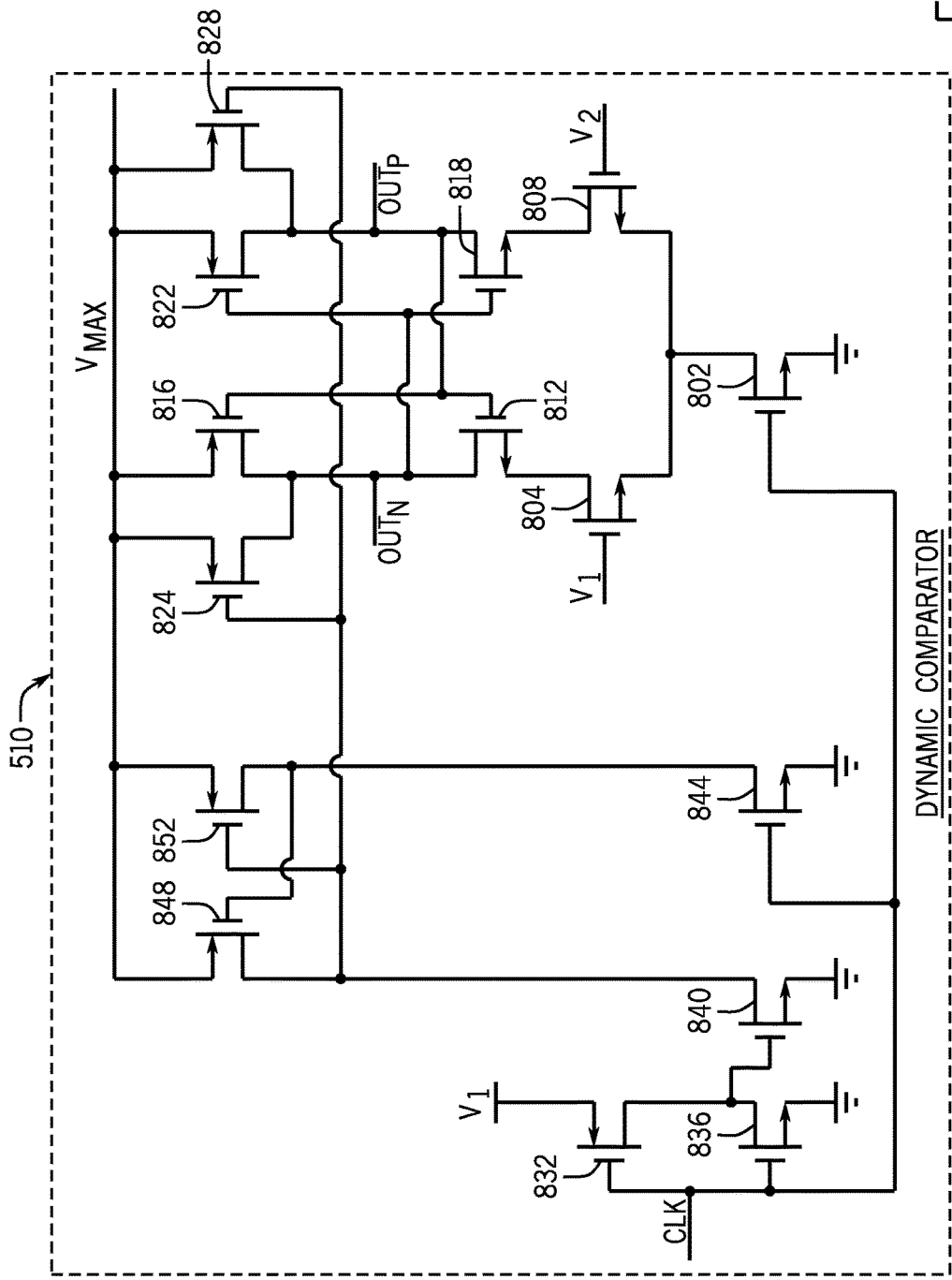
FIG. 8 is a schematic diagram of a dynamic comparator of the maximum supply voltage selector circuit of FIG. 5 according to an example embodiment.

Referring to FIG. 8, in accordance with example embodiments, the dynamic comparator 510 differentially indicates its comparison result using signals called "OUT$_P$" and "OUT$_N$." The dynamic comparator 510 includes back-to-back coupled complementary metal-oxide-semiconductor (CMOS) inverters. In this regard, a first CMOS inverter includes an NMOSFET 812 and a PMOSFET 816 and provides the OUT$_N$ signal, and the other CMOS inverter includes an NMOSFET 818 and a PMOSFET 822 and provides the OUT$_P$ signal.

The drains of biasing NMOSFETs 804 and 808 are coupled to the sources of the NMOSFETs 812 and 818, respectively, and the sources of the NMOSFETs 804 and 808 are coupled to a drain of an NMOSFET 802. The source of the NMOSFET 802 is coupled to ground, and the gate of the NMOSFET 802 receives the CLK clock signal. In this manner, when the CLK clock signal is asserted to a logic one state (for this example), the NMOSFET 802 pulls the sources of the NMOSFETs 804 and 808 to ground to, along with other circuitry (described below) allow the dynamic comparator 510 to power up and compare the V$_1$ and V$_2$ source supply voltages.

Other circuitry of the dynamic comparator 510 includes for powering up and down the comparator 510 in response to the CLK clock signal includes PMOSFETs 824 and 828 for purposes of pulling the OUTN and OUTP output signals, respectively, to a magnitude near or at the V$_3$ voltage when the dynamic comparator 510 is powered down. In this manner, the sources of the PMOSFETs 824 and 828 are coupled to a V$_3$ voltage (the voltage provided at the output terminal 183-1 (see FIG. 4) of supply switching circuit 310-1); the drains of the PMOSFETs 824 and 828 are coupled to the OUT$_N$ and OUT$_P$ voltages, respectively; and the gates of the PMOSFETS 824 and 828 are coupled to the drain of an NMOSFET 840. The source of the NMOSFET 840 is coupled to ground, and the gate of the NMOSFET 840 is coupled to the output terminal of a CMOS inverter, which is formed from an NMOSFET 836 and a PMOSFET 832, and whose input receives the CLK clock signal. Due to this arrangement, when the CLK clock signal is de-asserted (driven to a logic zero state for this example), the PMOSFETs 824 and 828 conduct to pull the OUT$_N$ and OUT signals to a magnitude at or near the V$_3$ voltage.

The CLK clock signal is also received at the gate of an NMOSFET 844. The source of the NMOSFET 844 is coupled to ground, and the drain of the NMOSFET 844 is coupled to the gate of a PMOSFET 848 and the drain of a PMOSFET 852. The gate of the PMOSFET 852 is coupled to the drain of the NMOSFET 840, the source of the PMOSFET 852 is coupled to the V$_3$ voltage, the source of the PMOSFET 848 is coupled to the V$_3$ supply voltage, and the drain of the PMOSFET 848 is coupled to the drain of the NMOSFET 840. Due to this arrangement, when the CLK clock signal is de-asserted (has a logic zero state, for example), the NMOSFET 844 and PMOSFET 848 are both turned off (do not conduct). When the CLK clock signal is asserted, the PMOSFET 848 and the NMOSFET 844 are biased on to aid in turning off the PMOSFETs 824 and 828.

When the $V_1$ source supply voltage is greater than $V_2$ source supply voltage, the drain-to-source current path of the NMOSFET 804 pulls the $OUT_N$ signal low to have a magnitude at or near ground, and the source-to-drain current path of the PMOSFET 822 pulls the OUT signal high to have a magnitude at or near the $V_3$ voltage, thereby causing the differential voltage $OUT_P$–$OUT_N$ to have a logic one level. When the $V_2$ source supply voltage is greater than the $V_1$ source supply voltage, the drain-to-source current path of the NMOSFET 808 pulls the OUT signal low to have a magnitude at or near ground, and the source-to-drain current path of the PMOSFET 816 pulls the $OUT_N$ signal high to have a magnitude at or near the $V_3$ voltage, thereby causing the differential voltage $OUT_P$–$OUT_N$ to have a logic zero level.

Figure 9:
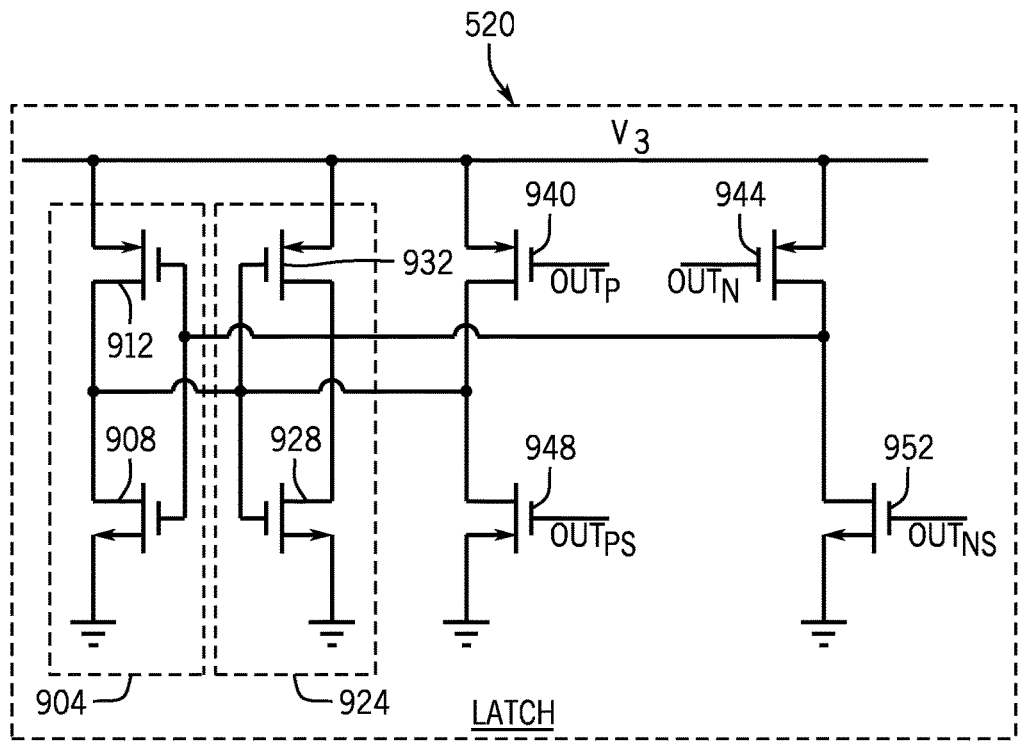
FIG. 9 is a schematic diagram of a latch of the maximum supply voltage selector circuit of FIG. 5 according to an example embodiment.

Referring to FIG. 9, in accordance with example embodiments, the latch 520 includes back-to-back coupled CMOS inverters 904 and 924. In this regard, the CMOS inverter 904 is formed from an NMOSFET 908 and a PMOSFET 912; and the CMOS inverter 924 is formed from an NMOSFET 928 and a PMOSFET 932. The output of the CMOS inverter 904 is coupled to drains of a PMOSFET 940 and NMOSFET 948. The source of the PMOSFET 940 is coupled to the $V_3$ voltage, and the source of the NMOSFET 948 is coupled to ground. Moreover, the gates of the PMOSFET 940 and NMOSFET 948 receive the positive comparator output signals $OUT_P$ and $OUT_{PS}$, respectively.

The input of the CMOS inverter 904 is coupled to the drains of a PMOSFET 944 and an NMOSFET 952. The sources of the PMOSFET 944 and NMOSFET 952 are coupled to the $V_3$ voltage and ground, respectively. The gates of the PMOSFET 944 and NMOSFET 952 receive the negative comparator output signals $OUT_N$ and $OUT_{NS}$, respectively.

Referring back to FIG. 5 in conjunction with FIGS. 7, 8 and 9, when the static comparator 500 (via its $OUT_{PS}$ and $OUT_{NS}$ signals) or the dynamic comparator 510 (via its OUT and $OUT_N$ signals) indicates a "10b" state ($V_1 > V_2$), the latch 520 asserts the $SEL_{1B}$ signal and de-asserts the $SEL_{2B}$ signal to couple the $V_1$ voltage to the $V_{MAX}$ terminal 302. When the static comparator 500 or the dynamic comparator 510 indicates a "01b" state ($V_2 > V_1$), the latch 520 asserts the $SEL_{2B}$ signal and de-asserts the $SEL_{1B}$ signal to couple the $V_2$ voltage to the $V_{MAX}$ terminal 302.

Figure 10:
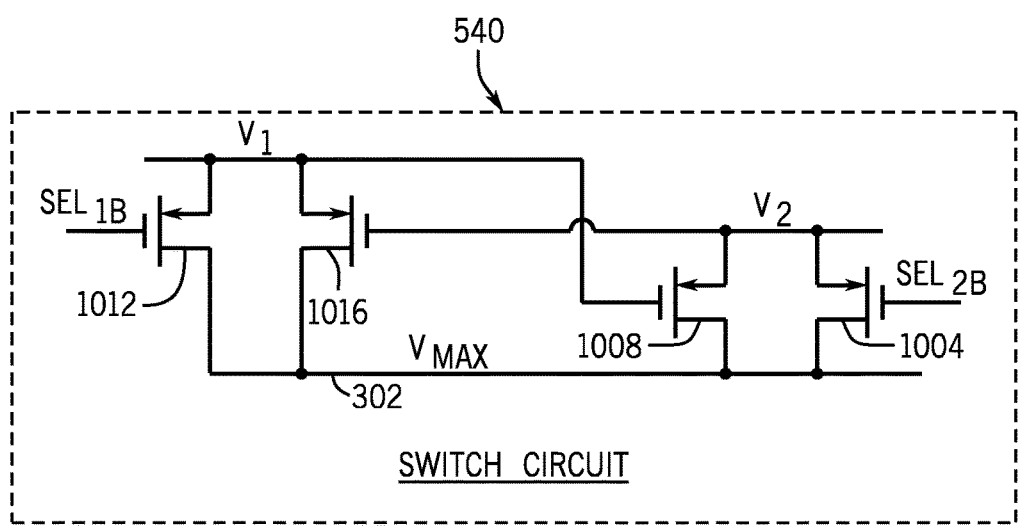
FIG. 10 is a schematic diagram of a switch circuit of the maximum supply voltage selector circuit of FIG. 5 according to an example embodiment.

Referring to FIG. 10, in accordance with example embodiments, the switch circuit 540 includes PMOSFETs 1004 and 1012 that respond to the $SEL_{2B}$ and $SEL_{1B}$ signals, respectively, to selectively couple the $V_2$ source supply voltage (using the PMOSFET 1004) or the $V_1$ source supply voltage (using the PMOSFET 1012) to the $V_{MAX}$ maximum supply voltage terminal 302. In this regard, the source-to-drain current paths of the PMOSFETs 1004 and 1012 are coupled between the $V_2$ and $V_1$ source supply voltages, respectively, and the $V_{MAX}$ maximum supply voltage terminal 302. A biasing PMOSFET 1008 has its source-to-drain current path coupled between the $V_2$ source supply voltage and the $V_{MAX}$ maximum supply voltage terminal 302, and the gate of the PMOSFET 1008 receives the $V_1$ source supply voltage. Likewise, a biasing PMOSFET 1016 has its source-to-drain current path coupled between the $V_1$ and the $V_{MAX}$ maximum supply voltage terminal 302, and the gate of the PMOSFET 1016 receives the $V_2$ source supply voltage.

Figure 11:
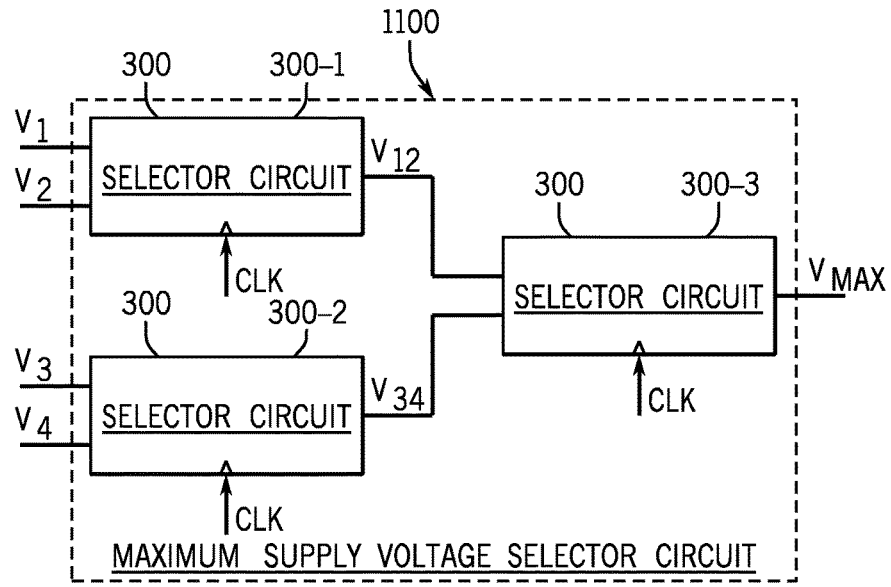
FIGS. 11 and 12A are schematic diagrams of maximum supply voltage selector circuits according to further example embodiments.

Other embodiments are contemplated, which are within the scope of the appended claims. For example, referring to FIG. 11, in further example embodiments, a maximum supply voltage selector circuit 1100 may be used to select the maximum voltage from more than two supply voltages. For this example embodiment, the maximum supply voltage selector circuit 1100 selects the maximum supply voltage from four source supply voltages called "$V_1$," "$V_2$," "$V_3$," and "$V_4$." As depicted in FIG. 11, in accordance with example embodiments, the maximum supply voltage selector circuit 1100 includes three maximum supply voltage selector circuits 300 (selector circuits 300-1, 300-2 and 300-3). In this regard, the selector circuit 300-1 provides a comparison of the magnitudes of the $V_1$ and $V_2$ supply voltages and provides a $V_{12}$ signal, which represents the maximum of the $V_1$ and $V_2$ voltages. The selector circuit 300-2 compares the magnitudes of the $V_3$ and $V_4$ signals and provides a $V_{34}$ voltage, which represents the maximum of the $V_3$ and $V_4$ voltages. Finally, the selector circuit 300-3 receives the $V_{12}$ and $V_{34}$ signals and provides the $V_{MAX}$ maximum supply voltage, which, for this embodiment, represents the maximum of the $V_1$, $V_2$, $V_3$ and $V_4$ supply voltages.

In accordance with further example embodiments, a relatively higher precision and higher power consuming comparator may be activated and deactivated (powered up and powered down, for example), for purposes of comparing source supply voltages, based on the difference between the voltages. In this manner, for relatively small voltage differences, the relatively higher precision comparator is activated to compare the source supply voltages; and for relatively large voltage differences, the higher precision comparator is deactivated, and a relatively lower precision and lower power consuming comparator makes the comparison.

Figure 12A:
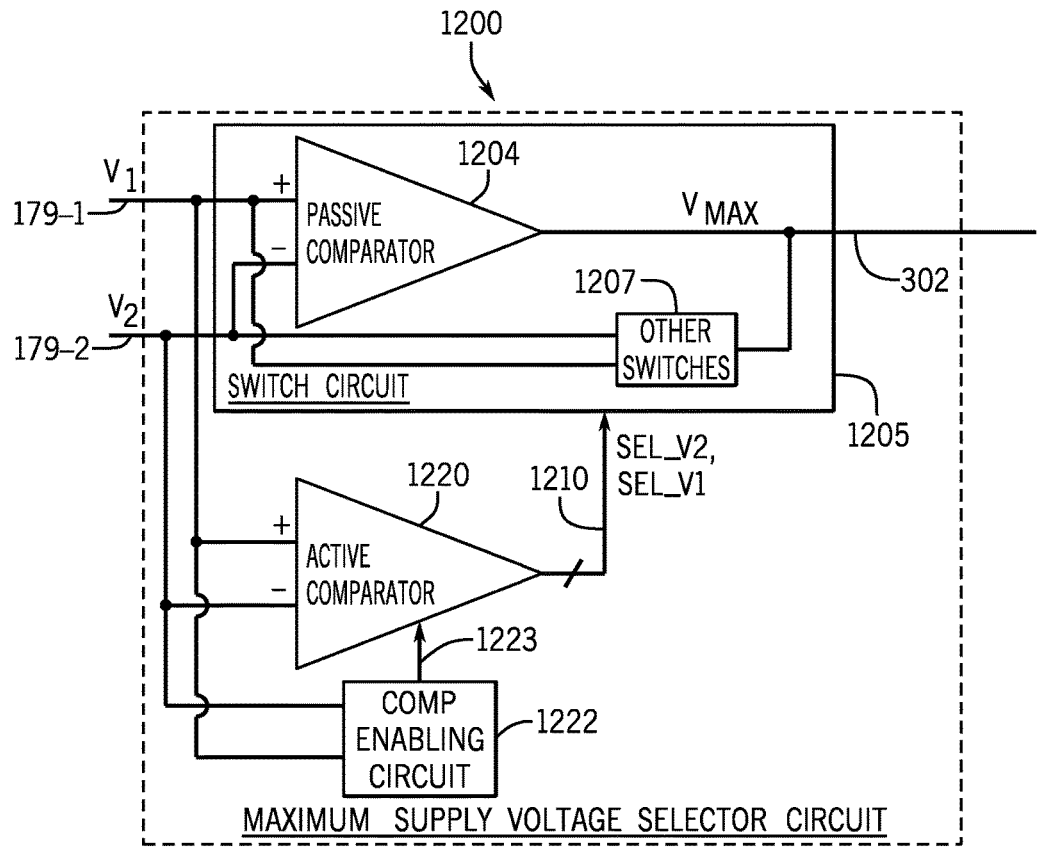

More specifically, referring to FIG. 12A, in accordance with example embodiments, a maximum supply voltage selector circuit 1200 includes a relatively lower precision and lower power consuming passive comparator 1204 and a relatively higher precision and higher power consuming active comparator 1220. In this context, a "passive comparator" refers to a circuit that compares signals at input terminals of the circuit and provides a signal representing the result of the comparison, without requiring substantial bias currents beyond its load current. Moreover, in this context, an "active comparator" refers to a circuit that compares signals at input terminals of the circuit and provides a signal representing the result of the comparison using substantial bias currents in additional to any load current.

In accordance with example embodiments, the passive comparator 1204 is enabled in response to the magnitude of the difference between the $V_1$ and $V_2$ source supply voltages being relatively large (greater than or equal to a MOSFET threshold voltage, the minimum gate to source voltage to create a conducting path between source and drain terminals of the MOSFET, for example). When enabled, the passive comparator 1204 compares the $V_1$ and $V_2$ source supply voltages to select the voltage having the higher magnitude and couples the selected voltage to the $V_{MAX}$ maximum supply terminal 302. Thus, in accordance with example embodiments, the passive comparator 1204, when enabled, performs functions of a switch circuit 1205 to couple the higher source supply voltage to the $V_{MAX}$ maximum supply terminal 302. The passive comparator 1204, in accordance with example embodiments, is disabled, in response to the magnitude of the difference between the $V_1$ and $V_2$ source supply voltages being relatively small (less than a MOSFET threshold voltage, for example).

The active comparator 1220, in accordance with example embodiments, is activated (powered up, for example) in response to the magnitude of the difference between the $V_1$ and $V_2$ source supply voltages being relatively small (less than a MOSFET threshold voltage, for example). When activated, the active comparator 1220 compares the $V_1$ and $V_2$ source supply voltages and correspondingly generates two switch control signals, called "SEL_V1" and "SEL_V2," to control operation of the switch circuit 1205. In this manner, the SEL_V1 and SEL_V2 signals control switches 1207 of the switch circuit 1205 for purposes of selecting the $V_1$, $V_2$ source supply voltage that has the highest magnitude to the $V_{MAX}$ maximum supply voltage terminal 302.

As depicted in FIG. 12A, the maximum supply voltage selector circuit 1200 may include a comparator enabling circuit 1222, which responds to the magnitude of the difference between the $V_1$ and $V_2$ source supply voltages for purposes of selectively activating the active comparator 1220 so that the comparator 1220 is enabled for the voltage difference that is below a predetermined threshold (a MOSFET threshold, for example). Thus, for relatively low voltage differences, the active comparator 1220 is activated and used to control the coupling of the $V_1$ and $V_2$ source supply voltages to the $V_{MAX}$ maximum supply voltage terminal 302; and for a relatively high voltage differences, the passive comparator 1204 is enabled and used to couple the higher of the $V_1$ and $V_2$ source supply voltages to the $V_{MAX}$ maximum supply voltage terminal 302. When the active comparator 1220 is deactivated, the comparator 1220 is at least partially, if not fully, powered down, thereby conserving power.

Figure 12B:
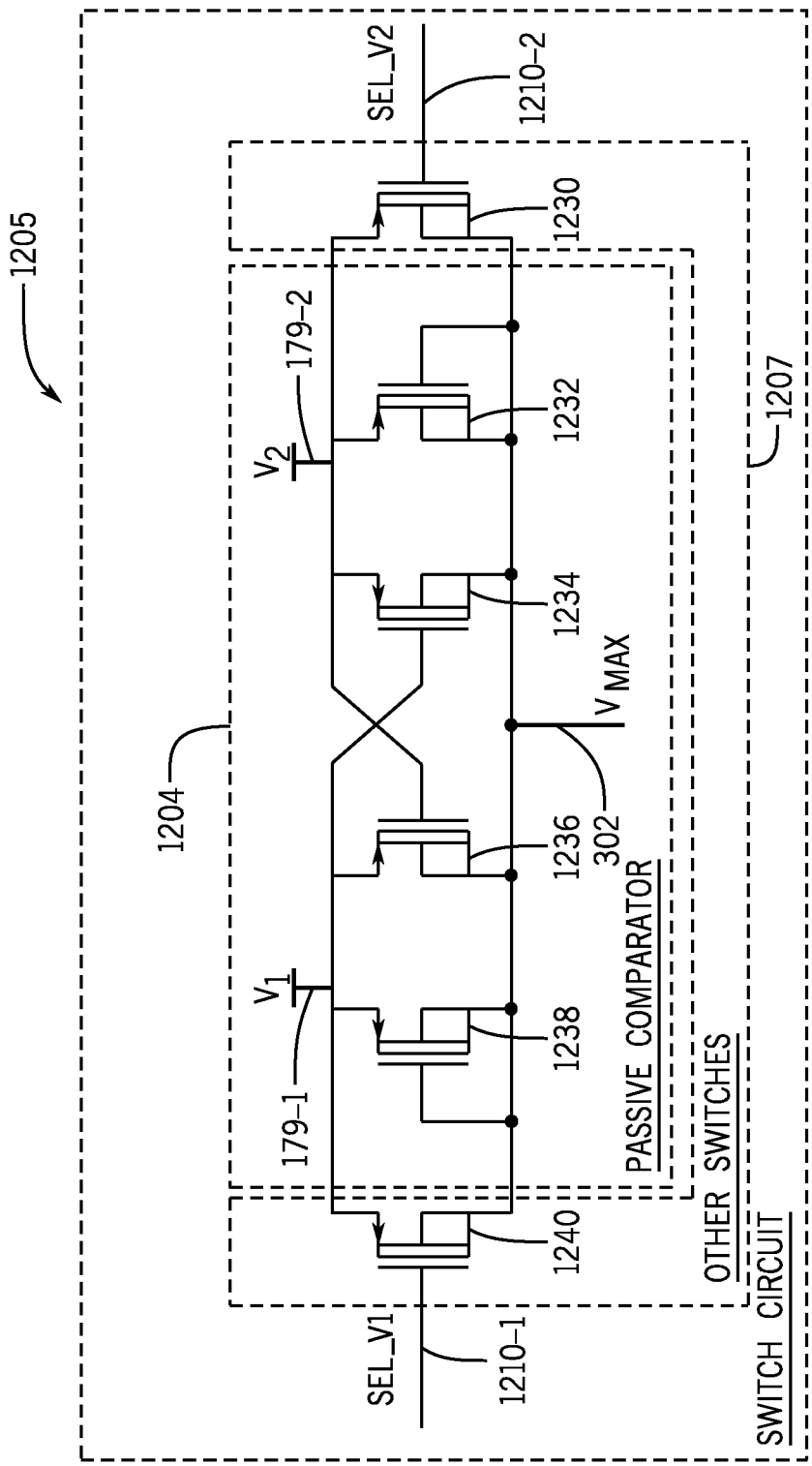
FIG. 12B is a schematic diagram of the switch of FIG. 12A according to an example embodiment.

Referring to FIG. 12B, in accordance with example embodiments, the passive comparator 1204 includes cross-coupled PMOSFETs 1234 and 1236, whose source-to-gate voltages are $V_2$–$V_1$ and $V_1$–$V_2$, respectively. If the $V_1$ source supply voltage is larger than $V_2$ source supply voltage by more than one source-to-gate threshold voltage, then the source-to-drain path of the PMOSFET 1236 conducts to couple the $V_1$, maximum supply voltage terminal 302 to the $V_1$ source supply voltage. If the $V_2$ source supply voltage is larger than the $V_1$ source supply voltage by more than one threshold voltage, then the source-to-drain path of the PMOSFET 1234 conducts to couple the $V_{MAX}$ maximum supply voltage terminal 302 to the $V_2$ source supply voltage. Consequently, the circuit formed from the PMOSFETS 1234 and 1236 controls coupling of the $V_1$ and $V_2$ source supply voltages to the $V_{MAX}$ maximum supply voltage terminal 302 if the $V_1$ and $V_2$ source supply voltages are more than one threshold voltage apart.

If, however, the $V_1$ and $V_2$ source supply voltages are within one threshold voltage from each other, the PMOSFETS 1234 and 1236 are turned off, i.e., the source-to-drain paths of both of these transistors do not conduct. In this case, other switches 1207 of the switch circuit 1205, formed from PMOSFETS 1230 and 1240, are controlled by the active comparator 1220 (FIG. 12A) for purposes of controlling the coupling of $V_1$ and $V_2$ source supply voltages to the $V_{MAX}$ maximum supply voltage terminal 302. In this manner, as depicted in FIG. 12B, the source-to-drain path of the PMOSFET 1230 is coupled between the $V_2$ source supply voltage and the $V_{MAX}$ maximum supply voltage terminal 302; and the gate of the PMOSFET 1230 receives the SEL_V2 signal from the active comparator 1220. The source-to-drain path of the PMOSFET 1240 is coupled between the $V_1$ source supply voltage and the $V_{MAX}$ maximum supply voltage terminal 302; and the gate of the PMOSFET 1240 receives the SEL_V1 signal from the active comparator 1220.

Thus, when the $V_1$ and $V_2$ source supply voltages are within one threshold voltage, the passive comparator 1204 is disabled and the PMOSFETs 1230 and 1240 are controlled by the active comparator 1220 for purposes of selectively coupling the highest of the $V_1$ and $V_2$ source supply voltages to the $V_{MAX}$ maximum supply voltage terminal 302. When the $V_1$ and $V_2$ source supply voltages are more than one threshold voltage apart, the active comparator 1220 is disabled, the passive comparator 1204 is enabled, and the cross-coupled PMOSFETs 1234 and 1236 of the passive comparator 1204 control which source supply voltage is coupled to the $V_{MAX}$ maximum supply voltage 302.

For purposes of conserving power consumption, the active comparator 1220 may have a relatively long response time. For purposes of preventing the $V_{MAX}$ maximum supply voltage from rapidly decreasing, or collapsing, while the active comparator 1220 is resolving which source supply voltage is larger, the passive comparator 1204 includes PMOSFETs 1232 and 1238, in accordance with example embodiments. As depicted in FIG. 12B, the source-to-drain path of the PMOSFET 1232 is coupled between the $V_2$ source supply voltage and the $V_{MAX}$ maximum supply voltage terminal 302; and the gate and drain terminals of the PMOSFET 1232 are coupled together. In a similar manner, the source-to-drain path of the PMOSFET 1238 is coupled between the $V_1$ source supply voltage and the $V_{MAX}$ maximum supply voltage terminal 302; and the gate and drain terminals of the PMOSFET 1238 are coupled together. Assuming that the $V_1$ source supply voltage is greater than the $V_2$ source supply voltage and the $V_{MAX}$ maximum supply voltage terminal 302 is associated with a load current (called "$I_L$"), then the PMOSFET 1238 limits the difference between the $V_1$ source supply voltage and the $V_{MAX}$ maximum supply voltage to the gate-to-source voltage that corresponds to the $I_L$ load current. Similarly, assuming that the $V_2$ source supply voltage is greater than the $V_1$ source supply voltage, the PMOSFET 1232 limits the difference between the $V_2$ source supply voltage and the $V_{MAX}$ maximum supply voltage to a gate-to-source voltage. Consequently, the $V_{MAX}$ maximum supply voltage does not collapse while the comparator is resolving which source supply voltage is larger.

Figure 12C:
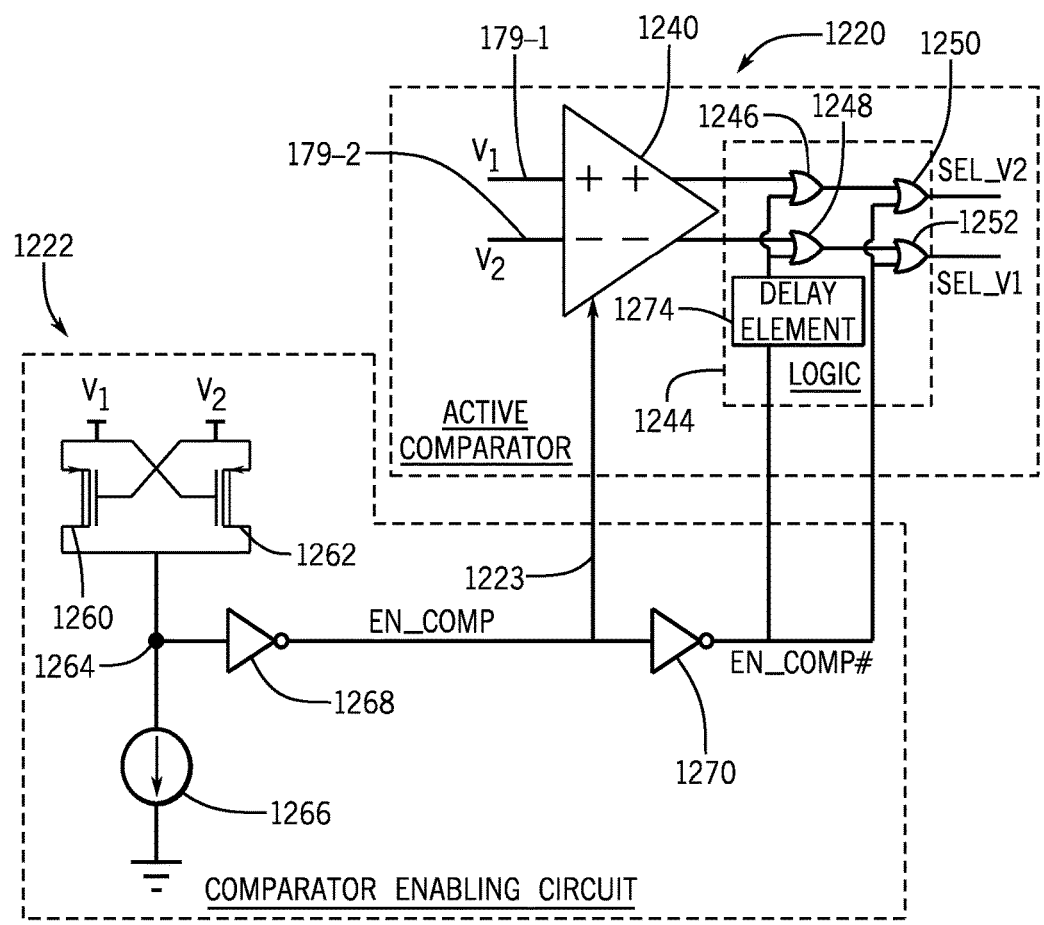
FIG. 12C is a schematic diagram of the comparator enabling circuit and the dynamic comparator of FIG. 12A according to an example embodiment.

Referring to FIG. 12C, in accordance with example embodiments, the comparator enabling circuit 1222 generates a comparator enable signal called "EN_COMP," which is received at an enable (or activation) terminal of an active voltage comparator 1240. In response to the assertion (driving to a logic one, for example) of the EN_COMP signal, circuitry of the active comparator 1240 powers up for purposes of allowing the comparator 1240 to respond to the $V_1$ and $V_2$ source supply voltages and furnish a corresponding differential output signal that represents the result of a comparison. Conversely, when the EN_COMP signal is de-asserted (driven to logic zero, for example), the active comparator 1240 is powered down, or deactivated.

The comparator enabling circuit 1222 includes cross-coupled PMOSFETs 1260 and 1262, which function similarly to the cross-coupled PMOSFETs 1236 and 1234 of the passive comparator/switch 1204 (FIG. 12B). As depicted in 12C, the source-to-drain path of the PMOSFET 1260 is coupled between the $V_1$ source supply voltage and a node 1264, and the gate of the PMOSFET 1260 is coupled to the $V_2$ source supply voltage. The source-to-drain path of the PMOSFET 1262 is coupled between the $V_2$ source supply voltage and the node 1264, and the gate of the PMOSFET 1262 coupled to the $V_1$ source supply voltage. In operation, if the $V_1$ and $V_2$ source supply voltages are more than one threshold voltage apart, the drains of the PMOSFETs 1260 and 1262 are pulled up to the higher voltage of the $V_1$ and $V_2$ supply source voltages. Conversely, if the $V_1$ and $V_2$ source supply voltages are less than one threshold voltage apart, the PMOSFETs 1260 and 1262 are turned off, and the node 1264 is pulled to ground by a current sink 1266. The node 1264 is coupled to the input of an inverter 1268, which provides the EN_COMP signal. Thus, when the difference in the $V_1$ and $V_2$ source supply voltages is less than the threshold voltage, the EN_COMP signal is asserted; and when the difference is greater than the threshold, the EN_COMP signal is de-asserted.

In accordance with example embodiments, the comparator enabling circuit 1222 has logic 1244 to convert the differential output of the comparator 1240 into the SEL_V1 and SEL_V2 signals. In accordance with some embodiments, the logic 1244 includes a delay element 1274, which along with OR gates 1246 and 1248, are used to deactivate, or "blank," the output of the comparator 1240 for a time delay that is set by the delay element 1274. The delay, in accordance with example embodiments, is constructed to be larger than the time for the comparator 1240 to resolve which of its input voltages is larger after being activated. After the delay time that is defined by the delay element 1274 lapses, the output of the comparator 1240 propagates to form the SEL_V1 and SEL_V2 signals.

Assuming that one of the $V_1$ and $V_2$ source supply voltages changes relatively fast and the resulting difference between the $V_1$ and $V_2$ voltages is larger than one threshold voltage, then either the PMOSFET 1260 or 1262 conducts to de-assert the EN_COMP signal. With the aid of OR gates 1250 and 1252, the output of the comparator 1240 is blanked, and as such, the SEL_V1 and SEL_V2 signals are both deasserted (driven to logic one, for example) to turn off the PMOSFETs 1240 and 1230, respectively, of the switch circuit 1205 (FIG. 12B). Consequently, for this scenario, the selection of the $V_1$ and $V_2$ source supply voltages is handled by the passive comparator 1204, and the speed of the comparator 1240 does not affect the $V_{MAX}$ maximum supply voltage.

Figure 13:
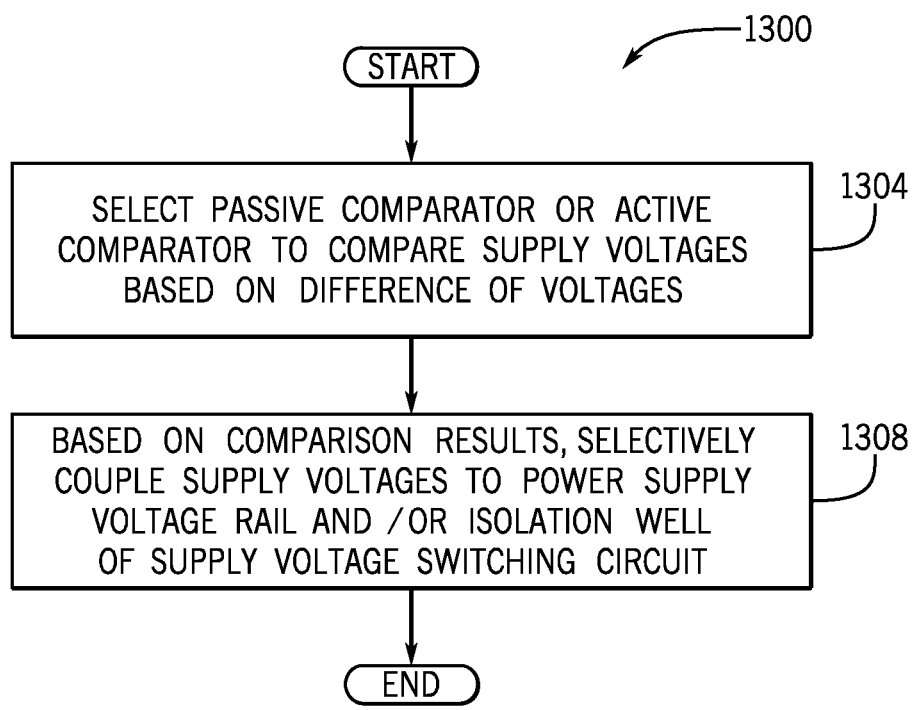

Thus, referring to FIG. 13, in accordance with example embodiments, a technique 1300 includes selecting (block 1304) a passive comparator or an active comparator to compare supply voltages based on a difference of the voltages; and selectively coupling (block 1308) the supply voltages (coupling the largest magnitude supply voltage, for example) to at least one power supply rail and/or at least one isolation well of a supply voltage switching circuit, based on the comparison results.

Figure 14:
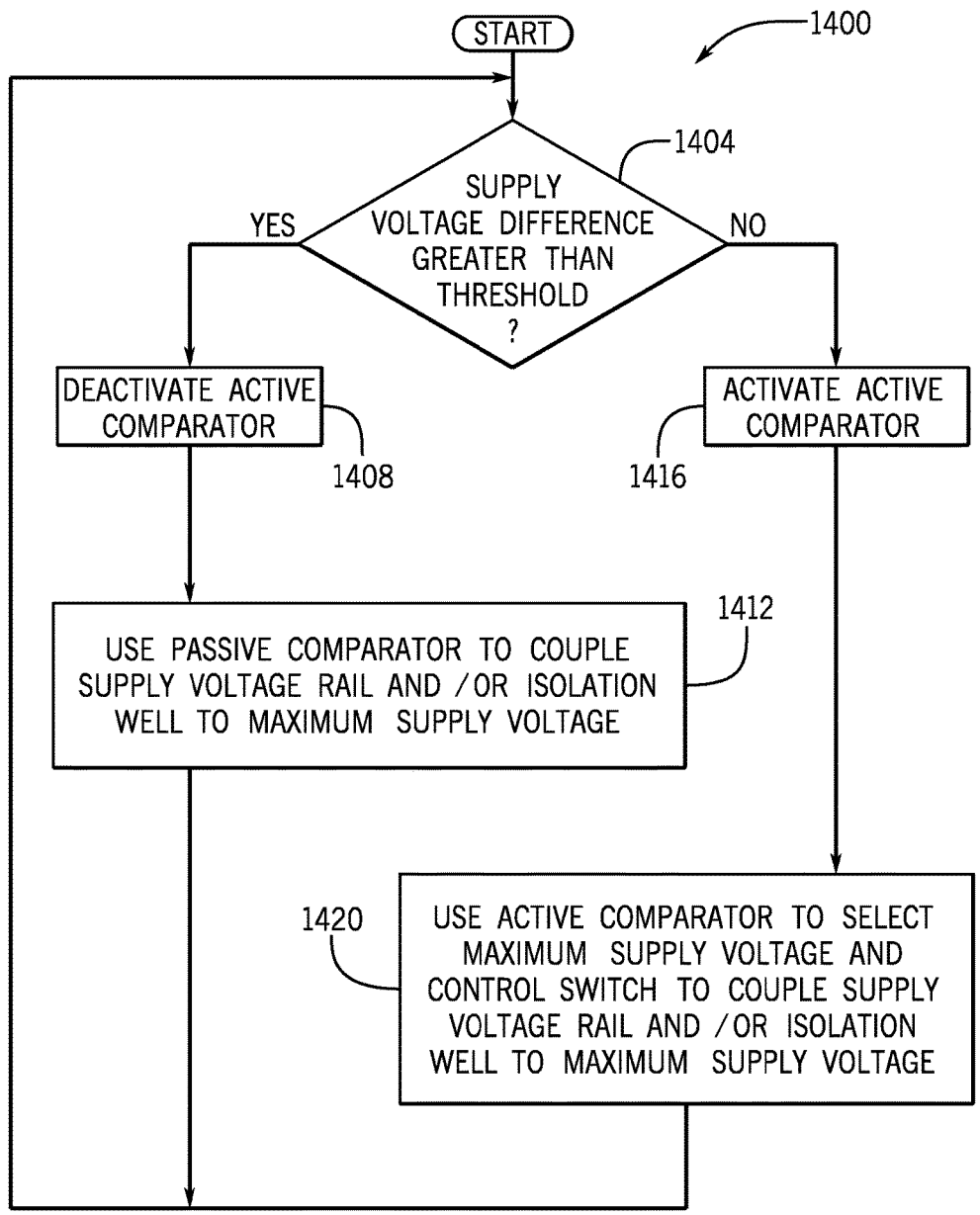

More specifically, referring to FIG. 14, in accordance with example embodiments described herein, a technique 1400 includes, in response to a supply voltage difference being greater than a threshold (block 1404), an active comparator is deactivated (block 1408), and a passive comparator is used (block 1412) to couple a supply voltage rail and/or isolation well to a maximum supply voltage. Otherwise, in response to the supply voltage difference not being greater than the threshold (block 1404), the active comparator is activated (block 1416) and used (block 1420) to couple the supply voltage rail and/or the isolation well to the maximum supply voltage.

In accordance with further embodiments, the circuitry that is described herein may be replaced by equivalent CMOS circuitry in which the PMOSFETs and NMOSFETS are juxtaposed, as can be appreciated by one of ordinary skill in the art. Moreover, in accordance with further embodiments, a maximum selector circuit that selectively activates and deactivates an active comparator based on a supply voltage difference may include a latch to maintain the coupling of the maximum supply voltage terminal to the maximum voltage. As another example, in accordance with a further embodiment, may compare more than two source supply voltages for purposes of coupling the maximum of these voltages to the maximum supply voltage terminal.

While a limited number of embodiments have been disclosed herein, those skilled in the art, having the benefit of this disclosure, will appreciate numerous modifications and variations therefrom. It is intended that the appended claims cover all such modifications and variations.

What is claimed is:

1. A method comprising:
   providing supply voltages to a supply voltage switching circuit that controls routing of the supply voltages to power consuming circuitry associated with the supply voltage switching circuit;
   comparing the supply voltages, comprising:
      using at least one relatively lower precision comparator to compare the supply voltages for a relatively large difference between the supply voltages; and
      using at least one relatively higher precision comparator to compare the supply voltages for a relatively smaller difference between the supply voltages; and
   based on a result of comparing the supply voltages, selectively coupling the supply voltages to at least one of an isolation well of the supply voltage switching circuit and a power supply rail of the supply voltage switching circuit.

2. The method of claim 1, wherein the at least one relatively higher precision comparator comprises an active comparator, the method further comprising:
   enabling the active comparator in response to a magnitude of a difference between the supply voltages being below a predetermined threshold.

3. The method of claim 1, wherein the at least one relatively lower precision comparator comprises a passive comparator, the method further comprising:
   disabling the active comparator in response to the magnitude of the difference between the supply voltages being above the predetermined threshold; and
   using the passive comparator to compare the supply voltages in response to the magnitude of the difference between the supply voltages being above the predetermined threshold.

4. The method of claim 1, wherein comparing the supply voltages comprises:
   comparing the supply voltages continuously over a given time interval using the at least one relatively lower precision comparator; and
   activating and deactivating at least one relatively higher precision comparator repeatedly over the given time interval to compare the supply voltages in response to being activated.

5. The method of claim 4, wherein activating and deactivating the at least one relatively higher precision comparator comprises clocking a dynamic comparator to periodically power a dynamic comparator to perform the comparison.

6. The method of claim 1, wherein selectively coupling comprises:
   selecting a given supply voltage of the supply voltages having the largest magnitude; and
   coupling the selected given supply voltage to the at least one isolation well or power supply rail.

7. The method of claim 6, further comprising:
   selecting another supply voltage of the supply voltages as having the largest magnitude; and coupling the another supply voltage to the at least one isolation well or power supply rail in substitution of the given supply voltage.

8. The method of claim 1, wherein selectively coupling comprises coupling the supply voltage having the largest magnitude to a level shifter circuit and the at least one isolation well or power supply rail.

9. An apparatus comprising:
a supply voltage switching circuit to selectively couple a plurality of supply voltages to power consuming circuitry associated with the supply voltage switching circuit;
at least one static comparator coupled to the supply voltages to compare magnitudes of the supply voltages;
at least one dynamic comparator coupled to the supply voltages to compare magnitudes of the supply voltages; and
at least one switch to selectively couple one of the supply voltages to a supply rail or isolation well of the supply voltage switching circuit based at least in part on comparison results indicated by the at least one static comparator and the at least one dynamic comparator.

10. The apparatus of claim 9, wherein the supply voltage switching circuit comprises a switching signal level shifter circuit and the at least one switch selectively couples the one of the supply voltages to a supply rail for the level shifter circuit.

11. The apparatus of claim 9, wherein the supply voltage switching circuit comprises an isolation well and the at least one switch selectively couples the one of the supply voltages to the isolation well.

12. The apparatus of claim 9, wherein the at least one switch is adapted to couple the supply voltage having the largest magnitude to the supply rail or isolation well of the supply voltage switching circuit.

13. The apparatus of claim 9, wherein the at least one static comparator comprises:
a cross-coupled comparator adapted to compare a first supply voltage and a second supply voltage of the plurality of supply voltages, indicate a first comparison result in response to the first and second supply voltages having magnitudes differing by at least a predetermined threshold, and indicated a second comparison result in response to the first and second supply voltages having magnitudes differing by less than the predetermined threshold.

14. The apparatus of claim 9, wherein the at least one dynamic comparator is adapted to:
in response to a clock signal having a first predetermined state, power up and compare magnitudes of a first power supply voltage and a second power supply voltage of the plurality of power supply voltages; and
in response to the clock signal having a second predetermined state, power down.

15. An apparatus comprising:
an integrated circuit adapted to receive multiple source supply voltages, the source supply voltages comprising a first source supply voltage and a second source supply voltage, and the integrated circuit comprising:
a supply voltage switching circuit to control routing of the source supply voltages to power consuming circuitry;
a passive comparator to respond to a magnitude of a difference between the first source supply voltage and the second source supply voltage being above a threshold to couple the greater of the first source supply voltage and the second source supply voltage to the supply voltage switching circuit;
an active comparator to respond to the magnitude of the difference between the first source supply voltage and the second source supply voltage being below the threshold to compare the first source supply voltage to the second source supply voltage; and
at least one switch to respond to a result of the comparison by the active comparator to couple the greater of the first source supply voltage and the second source supply voltage to the supply voltage switching circuit.

16. The apparatus of claim 15, wherein the integrated circuit further comprises a circuit to enable the active comparator in response to the magnitude of the difference being below the threshold.

17. The apparatus of claim 15, wherein the passive comparator comprises a limit circuit to limit a difference between the greater of the first source supply voltage and the second source supply voltage and a supply voltage coupled to the supply voltage switching circuit.

18. The apparatus of claim 15, wherein the at least one switch is adapted to respond to an output of the active comparator, the apparatus further comprising a circuit to delay a response of the at least one switch to the output of the active comparator to allow time for the active comparator to resolve which of the first source supply voltage and the second source supply voltage is larger.

19. The apparatus of claim 15, wherein the active comparator is adapted to at least partially power down when comparisons are not being made by the active comparator.

20. The apparatus of claim 15, wherein the passive comparator comprises a cross-coupled transistors to select the greater of the first and second source supply voltages and couple the greater of the first and second source supply voltages to the supply voltage switching circuit.

* * * * *